(12) United States Patent
Kuo et al.

(10) Patent No.: US 7,920,987 B2
(45) Date of Patent: Apr. 5, 2011

(54) DEVICE UNDER TEST DE-EMBEDDING

(75) Inventors: Shun-Meen Kuo, Chandler, AZ (US); Marcel N. Tutt, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 321 days.

(21) Appl. No.: 12/037,333

(22) Filed: Feb. 26, 2008

(65) Prior Publication Data

US 2009/0216480 A1 Aug. 27, 2009

(51) Int. Cl.
*G21C 17/00* (2006.01)

(52) U.S. Cl. ........ 702/183; 324/638; 702/117; 702/126; 703/13; 703/14; 714/733; 714/734

(58) Field of Classification Search .................. 324/638; 702/117, 118, 126, 183; 703/13, 14; 714/733, 714/734

See application file for complete search history.

(56) References Cited

U.S. PATENT DOCUMENTS 4,680,538 A * 7/1987 Dalman et al. ................. 324/638
4,680,761 A * 7/1987 Burkness ...................... 714/724
6,961,669 B2  11/2005 Brunsman

OTHER PUBLICATIONS

Cho, et al., "A Three-Step Method for the De-Embedding of High-Frequency S-Parameter Measurements," IEEE Transactions on Electron Devices, vol. 38, No. 6, Jun. 1991, pp. 1371-1375.
Koolen, et al., "An Improved De-Embedding Technique for On-Wafer High-Frequency Characterization," IEEE 1991 Bipolar Circuits and Technology Meeting, 8.1, pp. 188-191.
Liang, et al., "A Simple Four-Point Parasitic Deembedding Methodology for High-Frequency Scattering Parameter and Noise Characterization of SiGe HBTs," IEEE Transactions of Microwave Theory and Techniques, vol. 51, No. 11, Nov. 2003, pp. 2165-2174.
Vandamme, et al., "Improved Three-Step De-Embedding Method to Accurately Account for the Influence of Pad Parasitics in Silicon On-Wafer RF Test-Structures," IEEE Transactions on Electron Devices, vol. 48, No. 4, Apr. 2001, pp. 737-742.

* cited by examiner

*Primary Examiner* — Eliseo Ramos Feliciano
*Assistant Examiner* — Elias Desta

(57) ABSTRACT

A method of determining the intrinsic electrical characteristics of a device under test (DUT) includes determining a set of test measurements for a test structure including the device and determining test measurements for a number of de-embedding test structures. Based on the test measurements, DUT measurements are determined using both open-short and three-step de-embedding processes. The DUT measurements are combined to determine an imperfection error, which is used to adjust the calculations of a four-port de-embedding method. The adjusted calculations provide for a more accurate measurement of the parasitic elements in the test structure, thereby improving the determination of the intrinsic electrical characteristics of the device.

20 Claims, 8 Drawing Sheets

DEVICE UNDER TEST DE-EMBEDDING

FIELD OF THE DISCLOSURE

This invention relates in general to semiconductor devices and in particular to de-embedding semiconductor devices.

BACKGROUND

In the design of semiconductor devices such as high-frequency integrated circuits, it is sometimes desirable that only the intrinsic characteristics of a semiconductor device be incorporated in the design process. The intrinsic characteristics can be determined by characterizing a test device. However, determination of the intrinsic characteristics can be problematic due to unwanted parasitics in the characterization process resulting from the process of fabricating the associated test devices. De-embedding is a process that is utilized to remove the effects of the parasitics from the characteristics of the device under test.

FIGS. 1-6 are functional schematics of 2-port test structures typically used in prior art de-embedding processes. FIG. 1 is a schematic representation of test structure 101 that includes a transmission-configured two terminal device under test (DUT) 111, shown as a two-port network. Examples of such devices include capacitors, diodes, inductors, resistors, or any other two terminal devices. In one embodiment, DUT 111 is fabricated on a substrate of a semiconductor wafer with input port 103 and output port 107 located on the wafer surface for radio frequency (rf) characterization.

FIG. 2 is a schematic representation of a "through" test structure 201 typically used for de-embedding the electrical characteristics of DUT 111. It is desirable that test structure 201 have the same electrical length and port characteristics as test structure 101 exclusive of DUT 111.

FIG. 3 is a schematic representation of a "short" test structure 301 typically used for de-embedding the electrical characteristics of DUT 111. It is desirable that test structure 301 have the same port characteristics and the same electrical length as test structure 101, but with rf "shorts" at locations corresponding to the locations of the input and output ports of DUT 111.

FIG. 4 is a schematic representation of an "open" test structure 401 typically used for de-embedding the electrical characteristics of DUT 111. It is desirable that test structure 401 have the same port characteristics and the same electrical length as test structure 101, but with rf "opens" at locations corresponding to the locations of port-1 and port-2 the input and output ports of DUT 111.

FIG. 5 is a schematic representation of a "left" test structure 501 typically used for de-embedding the electrical characteristics of DUT 111. It is desirable that test structure 501 have the same port characteristics and the same electrical length as test structure 101, but with an rf "match" at the location corresponding to the location of the input port 103 and an rf "open" at the location corresponding to the location of the output port 107 of DUT 111.

FIG. 6 is a schematic representation of a "right" test structure 601 typically used for de-embedding the electrical characteristics of DUT 111. It is desirable that test structure 601 have the same port characteristics and the same electrical length as test structure 101, but with an rf "match" at the location corresponding to the location of the output port 107 and an rf "open" at the location corresponding to the location of the input port 103 of DUT 111.

Test structures 201, 301, 401, 501, and 601 (test structures 201-601) are constructed from the same fabrication process as test structure 101 of FIG. 1.

A variety of methods can be used with the test structures 201-601 to determine the intrinsic characteristics of DUT 111, such as the open-short method, three-step method, and four-port method. However, these methods individually may not de-embed the DUT 111, particularly for very high frequency semiconductor devices within desired parameters. Accordingly, a new process of de-embedding would be useful.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A method of determining the intrinsic electrical characteristics of a device under test (DUT) includes determining a set of test measurements for a test structure including the device and determining test measurements for a number of de-embedding test structures. Based on the test measurements, DUT measurements are determined using both open-short and three-step de-embedding processes. The DUT measurements are combined to determine an imperfection error, which is used to adjust the calculations of a four-port de-embedding method. The adjusted calculations provide for a more accurate measurement of the parasitic elements in the test structure, thereby improving the determination of the intrinsic electrical characteristics of the device.

Figure 1:
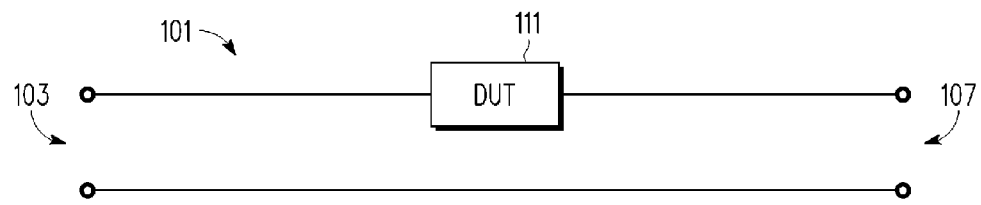
FIG. 1 is a schematic representation of a test structure for a device-under-test (DUT) used in a prior art de-embedding method.
Figure 2:
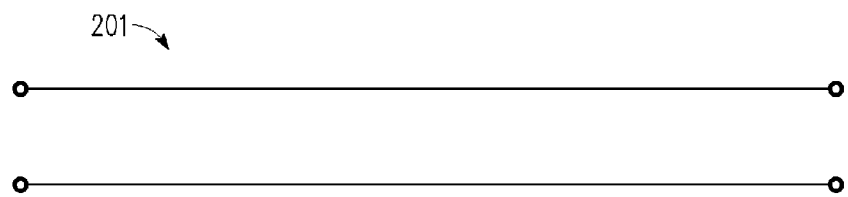
FIG. 2 is a schematic representation of a through test structure used in a prior art de-embedding method.
Figure 3:
FIG. 3 is a schematic representation of a short test structure used in a prior art de-embedding method.
Figure 4:
FIG. 4 is a schematic representation of an open test structure used in a prior art de-embedding method.
Figure 5:
FIG. 5 is a schematic representation of a left test structure used in a prior art de-embedding method.
Figure 6:
FIG. 6 is a schematic representation of a right test structure used in a prior art de-embedding method.
Figure 7:
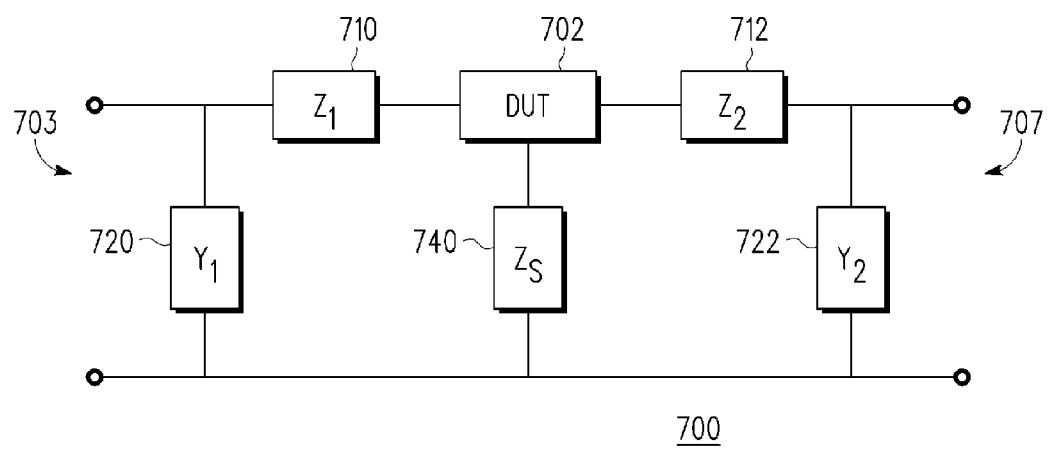
FIG. 7 is a schematic representation of one embodiment of an equivalent circuit for a two-port device under test in a test structure according to the present disclosure.

FIG. 7 illustrates a schematic diagram of an equivalent circuit 700 for a DUT test structure. DUT 702 is a device in which it is desired to obtain its intrinsic properties. Examples of such devices include capacitors, diodes, inductors, resistors, or any other two terminal devices in a semiconductor device. In an embodiment, the DUT 702 is a device specified for use in an integrated circuit targeted for high frequency applications. For example, the integrated circuit can be specified for frequencies of operation of 77 GHz or greater.

In one embodiment, DUT 702 is fabricated on the substrate of a semiconductor wafer with input port 703 and output port 707 located on the wafer surface for radio frequency (rf) characterization. Element 710 represents the series component and element 720 the parallel component of the parasitics of the structures between input port 703 and DUT 702, while element 712 represents the series component and element 722 the parallel component of the parasitics of the structures between output port 707 and DUT 702. The element 740 represents the parasitics resulting from a short imperfection between the DUT 702 and a ground plane.

The intrinsic characteristics of the DUT 702 can be determined by determining the characteristics of one or more test structures as illustrated in FIGS. 1-6, and applying one or more de-embedding processes to determine the characteristics of the parasitic structures. These de-embedding processes can include open-short, three-step, and four-port de-embedding processes, and combinations thereof. As used herein, an open-short method refers to a de-embedding process whereby measurements of the intrinsic characteristics of a device under test are determined based on measurements of an open test structure and a short test structure. The resulting measurements provide an indication of the values of intrinsic parallel parasitics (i.e. intrinsic characteristics that can be modeled as elements connected in parallel to the DUT, sometimes referred to as Y-characteristics) and the values of intrinsic series parasitics (i.e. intrinsic characteristics that can be modeled as elements connected in series to the DUT, sometimes referred to as Z-characteristics). An exemplary open-short method is discussed in Koolen et al., "An Improved De-Embedding Technique for On-Wafer High-Frequency Characterization", IEEE 1991 Bipolar Circuits and Technology Meeting 8.1, 1991, pp. 188-191.

As used herein, a three-step method refers to a de-embedding method based on measurements of an open test structure, a short test structure, and a thru test structure. An exemplary three-step method is discussed at H. Cho and D. E. Burk, "A Three-Step Method For The De-Embedding Of High-Frequency S-Parameter Measurements" IEEE Trans. Electron Devices, vol.38, no.6, pp.1371-1375, June 1991.

As used herein, a four-port process refers to a de-embedding process that models parasitics as a four-port system and determines intrinsic characteristics based on measurements of an open test structure, a short test structure, a thru test structure, a left test structure, and a right test structure. An exemplary embodiment of a four-port process is discussed at Q. Liang, J. D. Cressler, G. Niu, et al., "A Simple Four-Port Parasitic Deembedding Methodology For High-Frequency Scattering Parameter And Noise Characterization Of SIGE HBTS," IEEE Trans. Microwave Theory and Techniques, vol. 51, pp.2165-2174, 2003.

In an embodiment, the results of these de-embedding processes can be combined to determine the characteristics of a particular parasitic element. Once these characteristics are known, they can be used to further refine the results from another de-embedding method, thereby improving the accuracy of the results. This can be better understood with reference to FIG. 8, which illustrates a flow diagram of a particular embodiment of a method of determining the electrical characteristics for a device under test.

Figure 8:
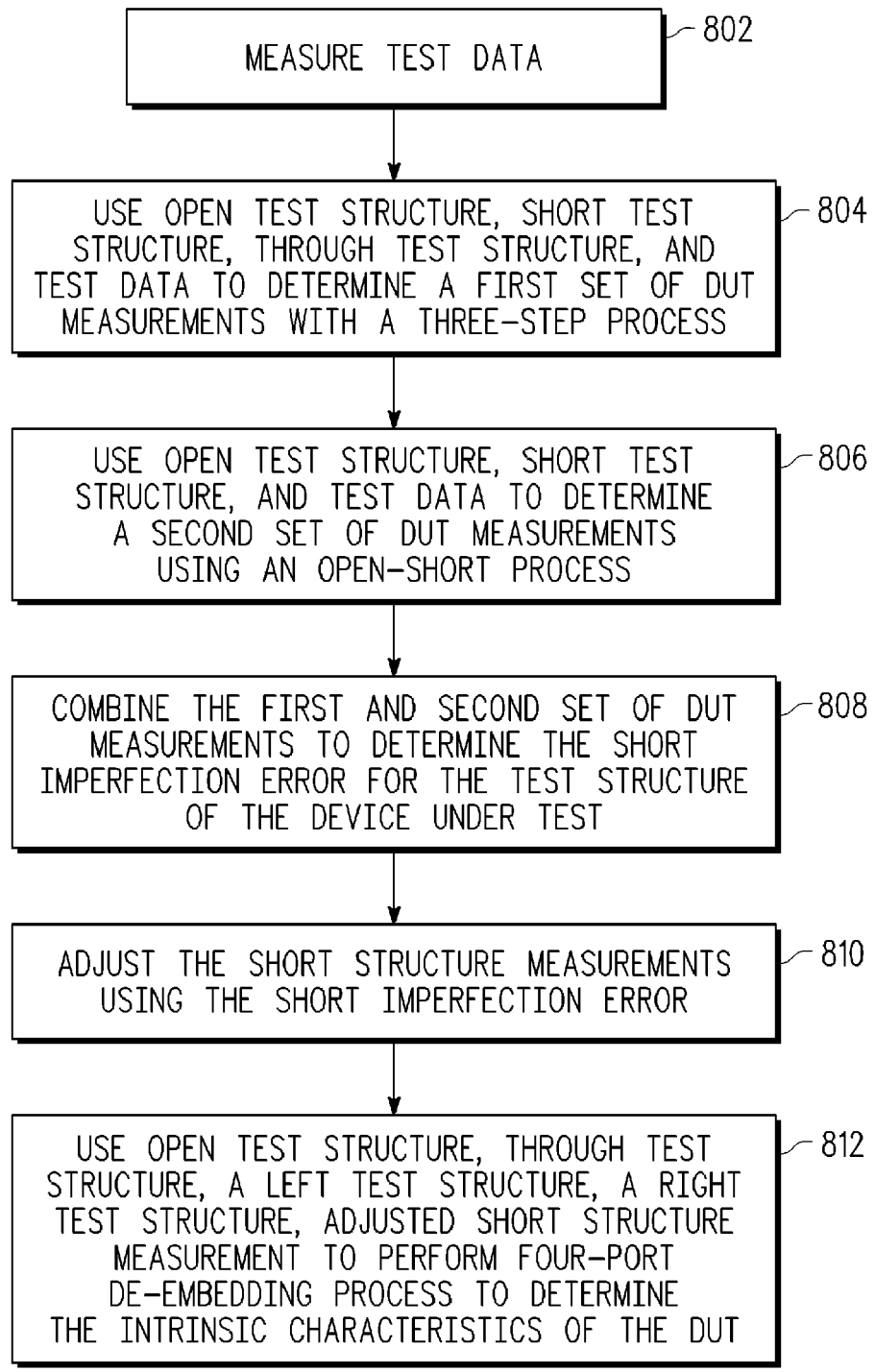
FIG. 8 is a flow diagram setting forth one embodiment of a de-embedding method according to the present disclosure.

Referring to FIG. 8, at block 802 test data is measured for a test structure including a DUT. In an embodiment, the measured test data includes scatter measurements for the test structure. At block 804, an open test structure, short test structure, and through test structure and the measured test data are used to determine a first set of DUT measurements with a three-step method. At block 806, the open test structure and short test structure together with the measured test data are used to determine a second set of DUT measurements using an open-short method. Moving to block 808, the first and second set of DUT measurements are combined to determine the short imperfection error for the test structure of the device under test. In an embodiment, the first and second sets of DUT measurements each result a matrix of values associated with series imperfections ($Z_3$-step and $Z_{O-S}$, respectively), and the measurements are combined by subtracting $Z_{O-S}$ from $Z_{3-step}$ to obtain the short imperfection error.

At block 810, the short test structure measurements are adjusted using the short imperfection error from block 808 to produce adjusted short test structure measurements. In an embodiment, the short test structure measurements are adjusted by subtracting the short imperfection results from the short test structure measurements. At block 812, the open test structure, the through test structure, a left test structure, a right test structure, adjusted short test structure measurements from block 810, and test data from block 802 are used to perform four-port de-embedding method to determine the intrinsic characteristics of the DUT. Accordingly, at block 812 the four-port method is performed using the adjusted short test structure measurements, rather than measurements obtained directly from the short test structure. For example, in a conventional four-port method, the characteristics of a short test structure would be measured, and those measurements, together with measurements of the characteristics of the open, through, left, and right test structures, would be used in the calculations for the intrinsic characteristics. At block 812, measurements for the open, through, left, and right test structures are obtained normally. Those measurements, together with the adjusted short test structure measurements obtained at block 810, are used to determine the results of the four-port method. By using the adjusted short test structure measurements, rather than measurements directly from the short test structure, the accuracy of the four-port method is increased. In particular, for devices specified for use in high frequency applications, the improved accuracy of the described de-embedding process allows for more accurate integrated circuit designs, as described further below. In addition, the accuracy of the four-port method can be further increased by correcting for load reactance according to conventional methods.

Figure 9:
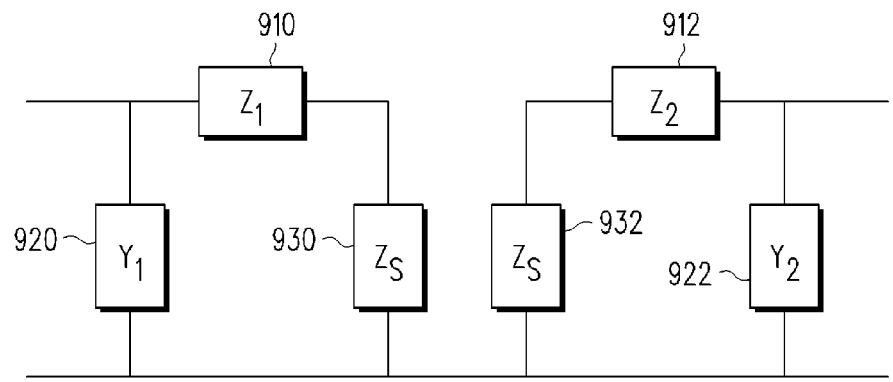
FIG. 9 is a schematic representation illustrating one embodiment of a partitioning of the electrical characteristics showing imperfections for the short standard of FIG. 2.
Figure 10:
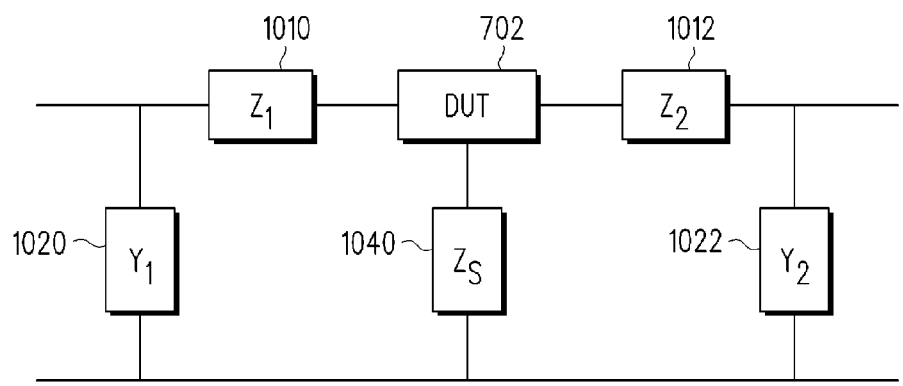
FIG. 10 is a schematic representation illustrating one embodiment of a partitioning of the electrical characteristics of based on a three-step de-embedding method according to the present disclosure.
Figure 11:
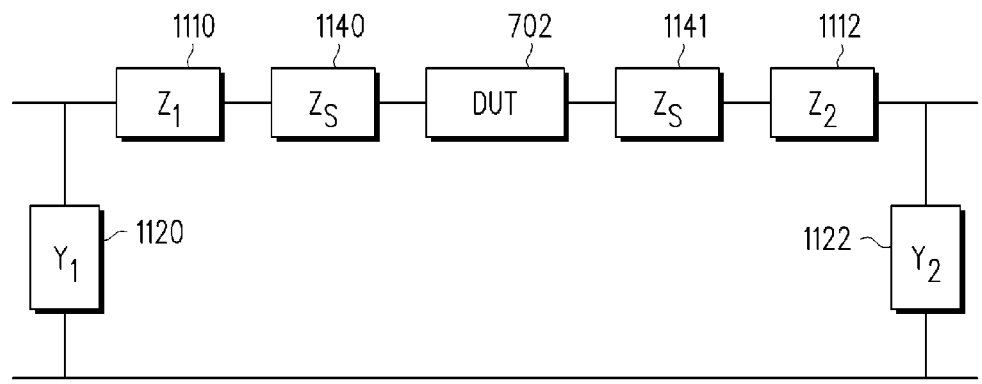
FIG. 11 is a schematic representation illustrating one embodiment of a partitioning of the electrical characteristics of based on an open-short de-embedding method according to the present disclosure.

The method of FIG. 8 can be better understood with reference to FIGS. 9-11. FIG. 9 illustrates a schematic diagram of one embodiment of an equivalent circuit for the short test structure 301 of FIG. 3. As illustrated, the short test structure includes parasitic elements 910, 912, 920, and 922, corresponding respectively to the parasitic elements 710, 712, 720, and 722 of FIG. 7. In addition, the equivalent circuit for the short test structure includes parasitic elements 930 and 932, each representing the short imperfections. Thus, by determining the values for the parasitic elements 930 and 932, the short imperfection can be determined. In a particular embodiment, these values of the parasitic elements 930 and 932 can be determined using the three-step and open-short de-embedding methods as described below with respect to FIGS. 10 and 11.

FIG. 10 illustrates one embodiment of a low-frequency equivalent circuit showing the position of parasitic elements as determined by the three-step method. In the illustrated example, the elements 1010, 1012, 1020, and 1022 correspond to the parasitic elements 910, 912, 920, and 922, respectively, of FIG. 9. Further, element 1040 corresponds to the short imperfection represented by elements 930 and 932 of FIG. 9. Thus, in the three-step method the short imperfection (as shown by element 1040) is represented by a shunt component between the DUT 702 and the ground plane. Further, as a shunt component the short imperfection will have a relatively small impact on the results of the three-step method. Accordingly, the three-step de-embedding method provides a good approximation of the values (labeled Z1, Z2, Y1, and Y2, respectively) for the parasitic elements 1010, 1012, 1020, and 1022.

FIG. 11 illustrates one embodiment of a low-frequency equivalent circuit showing the position of parasitic elements as determined by the open-short method. In the illustrated example, the elements 1110, 1112, 1020, and 1022 correspond to the parasitic elements 910, 912, 920, and 922, respectively, of FIG. 9. Further, elements 1140 and 1141 corresponds to the short imperfection represented by elements 930 and 932 of FIG. 9. Thus, in the open-short method the short imperfection (as shown by element 1040) is represented by a series element between the DUT 702 and the element 1110 and a series element between the DUT 1102 and the element 1112. Accordingly, the three-step de-embedding method provides the combined values for the parasitic elements 1110, 1112, 1120, and 1122 (Z1, Z2, Y1, and Y2, respectively) and the parasitic elements 1140 and 1141 corresponding to the short imperfection.

Accordingly, as illustrated in FIGS. 9 and 10, the three-step de-embedding method provides a good approximation of the values Z1, Z2, Y1, and Y2, while the open-short de-embedding method provides these values combined with the values for the short imperfection. Thus by removing the values Z1, Z2, Y1, and Y2, as indicated by the results of the three-step method from the results of the open-short method, the parasitic element values associated with the short imperfection can be determined.

Further, the four-port de-embedding method provides a good representation of the values for the parasitic elements in the test structure 700 of FIG. 7 over both low and high frequency ranges, but includes some error due to the short imperfection. Accordingly, the results of the four-port de-embedding method can be adjusted to achieve more accurate results by removing the short imperfection value from the short standard measurements during the de-embedding calculation of the four-port de-embedding method.

Figure 12:
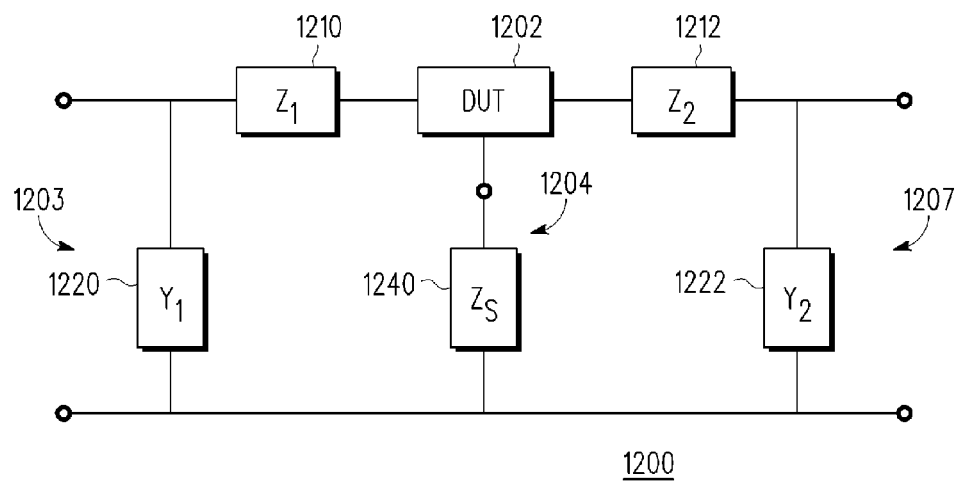
FIG. 12 is a schematic representation of one embodiment of an equivalent circuit for a three-port device under test in a test structure according to the present disclosure.

Referring to FIG. 12, a schematic diagram of an equivalent circuit 1200 for a three-terminal DUT 1202. Examples of such devices include transistors, or any other three terminal devices in an integrated circuit. In one embodiment, DUT 1202 is fabricated on the substrate of a semiconductor wafer with port 1203, port 1207, and port 1209 located on the wafer surface for radio frequency (rf) characterization. Element 1210 represents the series component and element 1220 the parallel component of the parasitics of the structures between port 1203 and DUT 1202, while element 1212 represents the series component and element 1222 the parallel component of the parasitics of the structures between port 1207 and DUT 1202. The element 1240 represents the parasitics resulting from a short imperfection between the DUT port 1209 and a ground plane. For relatively low frequency devices, the short imperfection has a minimal effect on the characteristics of the DUT 1202, but in high-frequency devices the effect can become significant, and the accuracy of the de-embedding method improved by removing the short imperfection.

Figure 13:
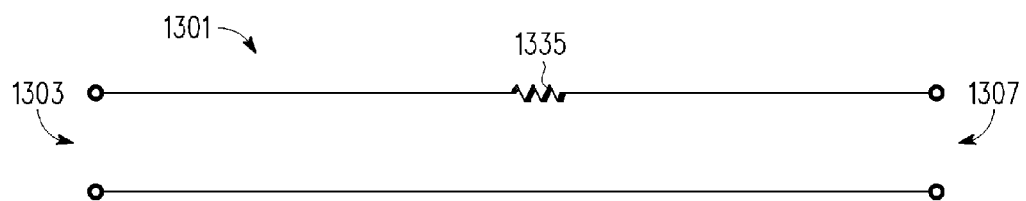
FIG. 13 is a schematic representation of one embodiment of a resistive test structure according to the present disclosure.

The method described above with respect to FIG. 8 can be used to approximate the short imperfection represented by element 1240. However, because the DUT 120 is a three-port device, using test results obtained from the DUT 120 in the open short method will result in measurements that include effects of the short imperfection as a shunt, as well as a series element. Accordingly, extracting the effects of the parasitic values Z1, Z2, Y1, and Y2, as identified by the three-step de-embedding method, from the results of the open short method will not directly indicate the value of the short imperfection. Thus, an additional test structure can be used to determine the short imperfection for a three-terminal DUT. A particular embodiment of such an additional test structure is illustrated in FIG. 13, which shows a test structure 1301, configured similarly to a through test structure, but including a resistive element 1335.

Figure 14:
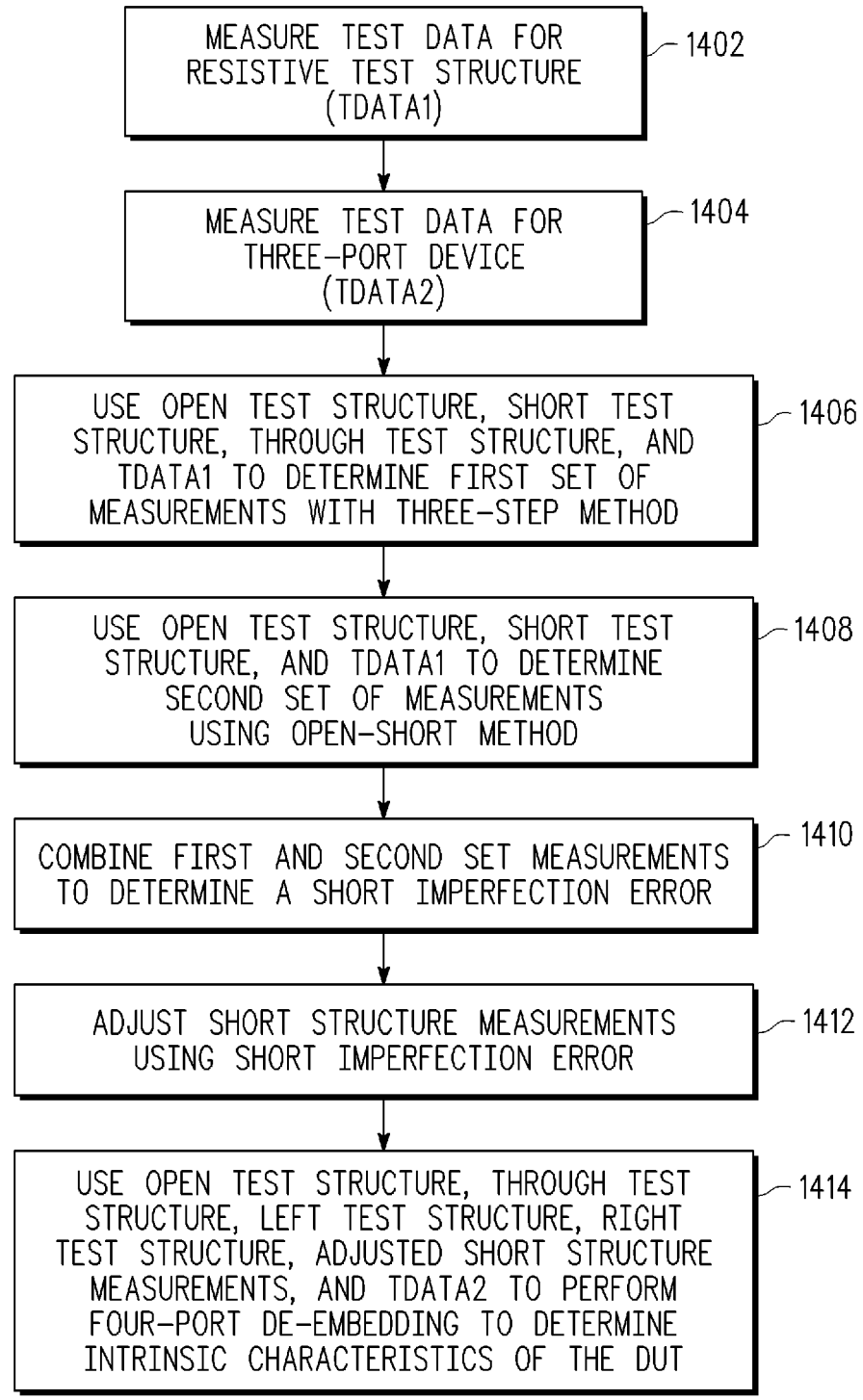
FIG. 14 is a flow diagram of a method of de-embedding a three-port device under test in accordance with one embodiment of the present disclosure.

The use of the test structure 1301 can be better understood by referring to FIG. 14. At block 1402 test data is obtained for the test structure 1301, treating the resistive element 1335 as the device under test. For purposes of discussion, these test results will be referred to as TDATA1. At block 1404 test data is obtained using the three-port device as the device under test. These test results will be referred to as TDATA2. At block 1406, the three-step method is performed using TDATA1 (i.e. test data from the test structure 1301). Similarly, at block 1408, the open-short method is performed using TDATA1. At block 1410, a short imperfection error is determined by combining the results from blocks 1406 and 1408. In an embodiment, the first and second sets of DUT measurements each result a matrix of values associated with series imperfections ($Z_{3\text{-}step}$ and $Z_{O\text{-}S}$, respectively), and the measurements are combined by subtracting $Z_{O\text{-}S}$ from $Z_{3\text{-}step}$ to obtain the short imperfection error.

At block 1412, short test structure measurements are adjusted based on the short imperfection error obtained at block 1410. In particular, the short imperfection error is subtracted from the short test structure measurements to obtain adjusted short measurements. At block 1414, the four-port method is performed using the adjusted short measurements, rather than measurements obtained directly from the short test structure. In addition, at block 1414, TDATA2 (i.e. test data obtained using the three-port device as the DUT) is used for the four port method. Accordingly, for a three-port device, the adjusted short measurements are obtained using the test structure 1301. These adjusted short measurements are then used to perform the four-port method in conjunction with test data obtained from the three-port device itself. This provides for more accurate measurement of intrinsic characteristics of a three-port device.

Figure 15:
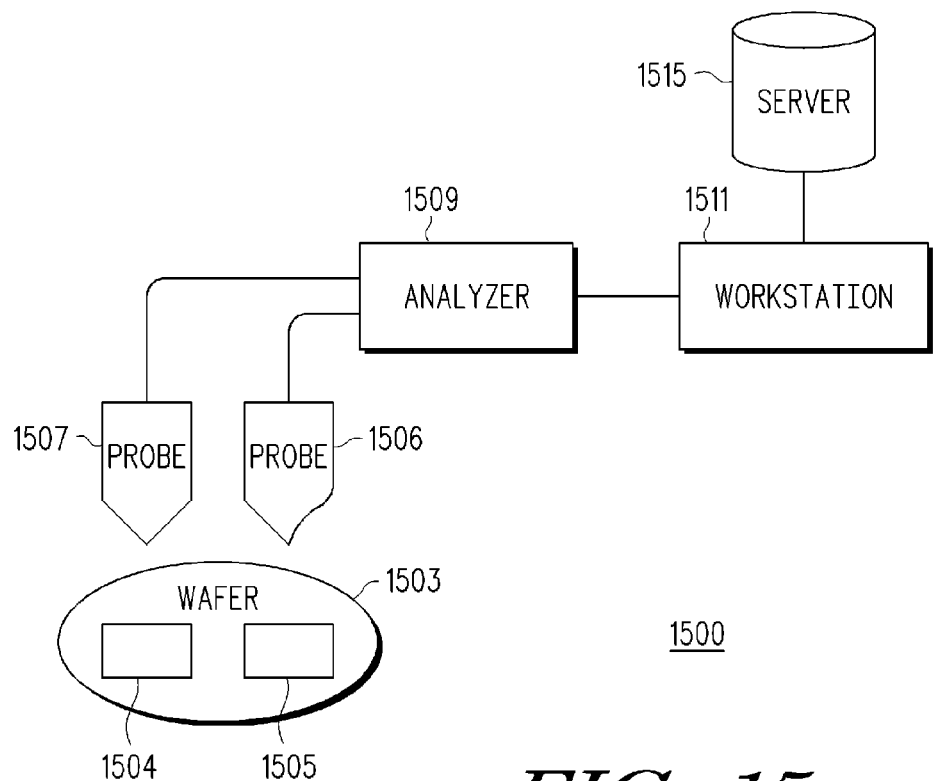
FIG. 15 is block diagram of one embodiment of a system for obtaining intrinsic characteristics of a DUT according to the present disclosure.

FIG. 15 is a block diagram of one embodiment of a system 1500 for obtaining intrinsic characteristics of a DUT according to the present invention. A DUT is located in a test structure 1505 fabricated on the substrate of wafer 1503. Test structures 1504 are also located on wafer 1503. Probes 1506 and 1507 are used to obtain S parameter data from structures 1504 and structure 1505. The probes are operably coupled to calibrated automatic network analyzer 1509. Network analyzer 1509 is controlled by software running on workstation 1511. The software is downloaded from storage media (e.g. hard drives) of a server 1515 by workstation 1511. In other embodiments, the software may be located on a hard drive of personal computer system or downloaded from a removable media (e.g. CD-Rom). The workstation 1511 executes the software to control the analyzer 1509, thereby executing one or more of the methods described herein.

Figure 16:
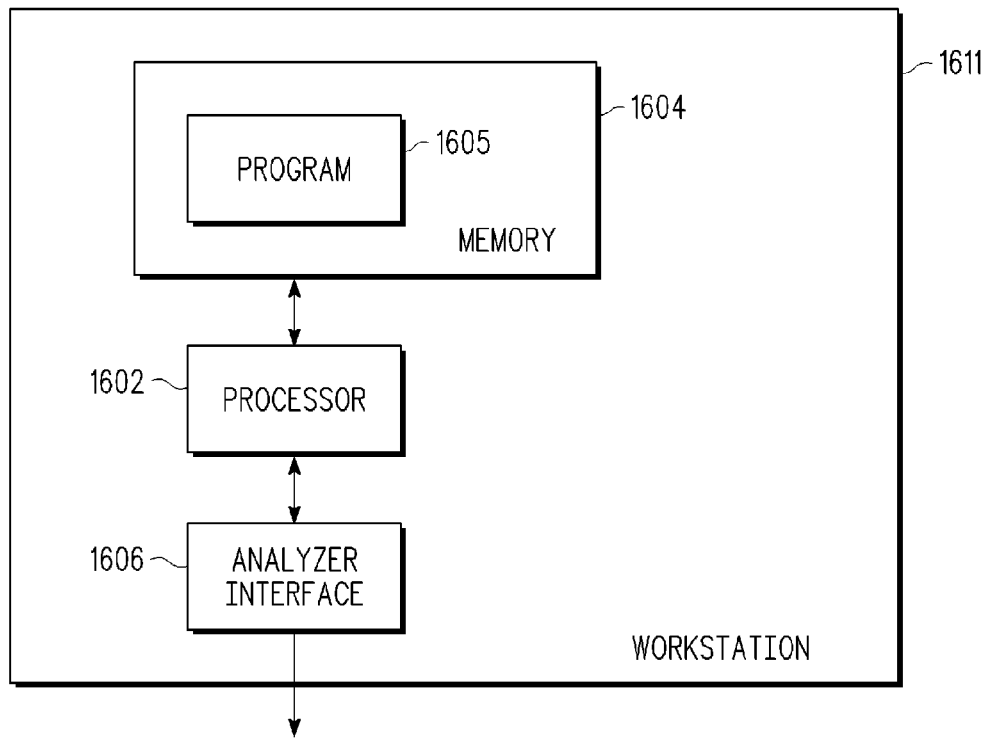
FIG. 16 is a block diagram of one embodiment of a workstation of the system of FIG. 15.

FIG. 16 illustrates a block diagram of a particular embodiment of a workstation 1611, corresponding to the workstation 1511 of FIG. 15. The workstation 1611 includes a processor 1602, a memory 1604, and an analyzer interface 1606. The memory 1604 is accessible to the processor 1602. In addition, the analyzer interface 1606 is connected to the processor 1602.

The processor 1602 can be a microprocessor, controller, or other processor capable of executing a series of instructions. The memory 1604 is a computer readable medium such as random access memory (RAM), non-volatile memory such as flash memory or a hard drive, and the like. The memory 1604 stores a program 1605 including a set of instructions to manipulate the processor 1602 to perform one or more of the methods disclosed herein. For example, the program 1605 can manipulate the processor 1602 to control the analyzer interface 1606 and can be used to store data, including test results. Via the analyzer interface 1606, the processor 1602 controls the analyzer 1509 (FIG. 15) to determine the intrinsic characteristics of a device under test, as described herein. The intrinsic characteristics can be stored in the memory 1604. It will be appreciated that other types of systems can be used in other embodiments to execute one or more of the methods described herein.

Figure 17:
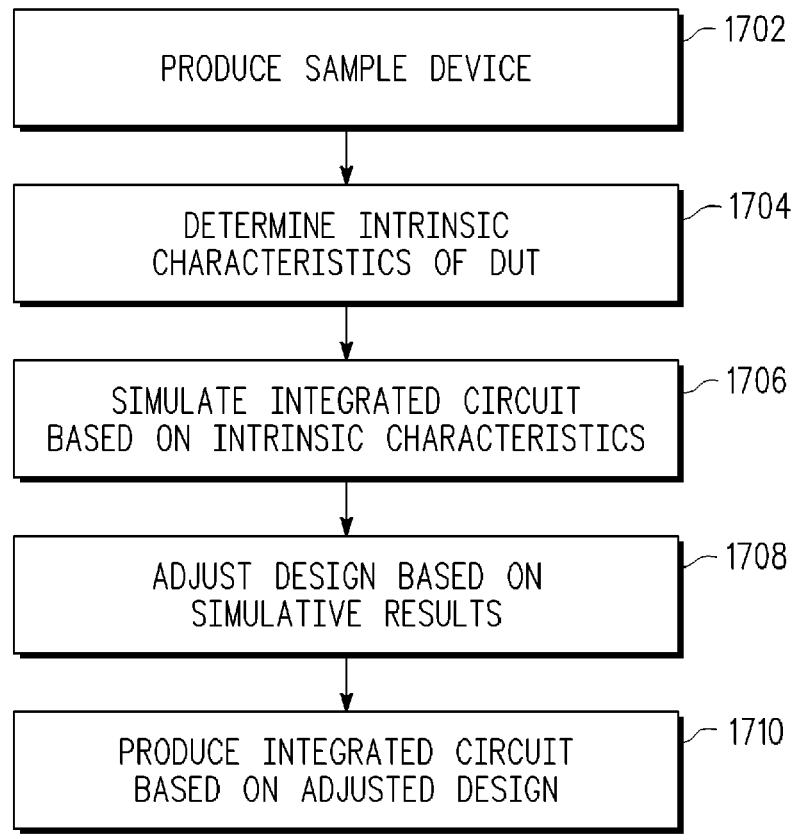
FIG. 17 is a flow diagram of a method of designing and producing an integrated circuit device according to one embodiment of the present disclosure.

Referring to FIG. 17, a flow diagram of a particular embodiment of a method of designing and producing an integrated circuit device is illustrated. At block 1702, a sample device is produced. In an embodiment, the sample device is an integrated circuit device including a device under test (DUT). The sample device is formed so that the intrinsic characteristics of the DUT will closely match those of the integrated circuit device being designed.

At block 1704, the intrinsic characteristics of the DUT are determined using one or more of the methods described herein. At block 1706, the integrated circuit under design is simulated, using the intrinsic characteristics of the DUT. For example, if the DUT is a capacitor, one or more of the capacitors of the integrated circuit is simulated based on the determined intrinsic characteristics. The improved accuracy of the de-embedding results provided by the methods described herein allows for more accurate simulation of the integrated circuit operation. Accordingly, the design process is improved, as the simulations more accurately predict operation of the integrated circuit device, particularly in high-frequency applications.

At block 1708, the integrated circuit design is adjusted based on the simulation results. For example, the simulation results can indicate that one or more modules of the integrated circuit device do not function according to a specification. The design of those modules can be adjusted to comply with the specification. At block 1710 an integrated circuit is formed based on the adjusted integrated circuit design.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method, comprising:
   determining at a processor device a first set of test measurements based on a first test structure;
   determining at the processor device a first device under test (DUT) measurement based on an open test structure, a short test structure, and a through test structure and based on the first set of test measurements;
   determining at the processor device a second DUT measurement based on the open test structure and the short test structure and based on the first set of test measurements;
   calculating at the processor device an imperfection error based on the first DUT measurement and the second DUT measurement;
   determining at the processor device a set of intrinsic electrical characteristics for a device under test based on the open test structure, the short test structure, the through test structure, a left test structure and a right test structure and based on the imperfection error; and
   storing the set of intrinsic electrical characteristics.

2. The method of claim 1, wherein the first test structure includes the device under test.

3. The method of claim 1, wherein determining a set of intrinsic electrical characteristics comprises:
   determining a second set of test measurements based on a second test structure including the device under test; and
   determining the set of intrinsic electrical characteristics based on the second set of test measurements.

4. The method of claim 3, wherein the first set of test measurements is associated with a two-port test structure and the second set of test measurements is associated with a three-port device.

5. The method of claim 4, wherein the two-port test structure includes a resistive element.

6. The method of claim 1, wherein calculating an imperfection error comprises subtracting the second test measurement from the first test measurement to determine the imperfection error.

7. The method of claim 1, wherein determining the set of intrinsic electrical characteristics comprises subtracting the imperfection error from test measurements of the short test structure.

8. The method of claim 1, wherein determining the first DUT measurement comprises determining the first DUT measurement based on a three-step method.

9. The method of claim 1, wherein determining the second DUT measurement comprises determining the second DUT measurement based on a three-step method.

10. The method of claim 1, wherein determining the set of intrinsic electrical characteristics comprises determining the set of intrinsic electrical characteristics based on a four-port method.

11. The method of claim 1, wherein the first set of test parameters comprise scatter measurements.

12. The method of claim 1, wherein the device under test is a two terminal device.

13. The method of claim 1, further comprising designing an integrated circuit device based on the set of intrinsic electrical characteristics to produce an integrated circuit design.

14. The method of claim 13, further comprising forming an integrated circuit based on the integrated circuit design.

15. A method, comprising:
  determining at a processor device a first set of test measurements based on a first test structure including a device under test;
  determining at the processor device a first DUT measurement based on the first set of test measurements and a three-step de-embedding method;
  determining at the processor device a second DUT measurement based on the first set of test measurements and an open-short de-embedding method;
  determining at the processor device an imperfection error based on the first DUT measurement and the second DUT measurement;
  determining at the processor device a set of intrinsic electrical characteristics based on the imperfection error and a four-port de-embedding method; and
  storing the set of intrinsic electrical characteristics.

16. The method of claim 15, wherein the imperfection error is a short imperfection error.

17. The method of claim 15, wherein determining the first set of test measurements comprises determining a set of scatter parameter measurements for the device under test.

18. A non-transitory computer readable medium containing a computer program, the computer program comprising instructions that, when executed by a processor, perform a method comprising:
  determining a first set of test measurements based on a first test structure;
  determining a first device under test (DUT) measurement based on an open test structure, a short test structure, and a through test structure and based on the first set of test measurements;
  determining a second DUT measurement based on the open test structure and the short test structure and based on the first set of test measurements;
  calculating an imperfection error based on the first DUT measurement and the second DUT measurement; and
  determining a set of intrinsic electrical characteristics for the device under test based on the open test structure, the short test structure, the through test structure, a left test structure and a right test structure and based on the imperfection error.

19. The non-transitory computer readable medium of claim 18, wherein the first test structure includes the device under test.

20. The non-transitory computer readable medium of claim 18, wherein the instructions to determine a set of intrinsic electrical characteristics comprise instructions, when executed by the processor, perform a method to:
  determining a second set of test measurements based on a second test structure including the device under test; and
  determining the set of intrinsic electrical characteristics based on the second set of test measurements.

* * * * *